(12) United States Patent
Nakamura et al.

(10) Patent No.: US 8,248,333 B2
(45) Date of Patent: Aug. 21, 2012

(54) DISPLAY DEVICE

(75) Inventors: Norihiro Nakamura, Mobara (JP);
Yasuharu Yatsu, Chiba (JP); Hajime Akimoto, Kokubunji (JP)

(73) Assignees: Hitachi Displays, Ltd., Chiba (JP);
Panasonic Liquid Crystal Liquid Crystal Display Co., Ltd., Hyogo-ken (JP)

( * ) Notice: Subject to any disclaimer, the term of this patent is extended or adjusted under 35 U.S.C. 154(b) by 573 days.

(21) Appl. No.: 12/538,963

(22) Filed: Aug. 11, 2009

(65) Prior Publication Data

US 2010/0039454 A1 Feb. 18, 2010

(30) Foreign Application Priority Data

Aug. 13, 2008 (JP) ................................. 2008-208614

(51) Int. Cl.
*G09G 3/30* (2006.01)
(52) U.S. Cl. ........................................... 345/77; 345/76
(58) Field of Classification Search .................. 345/76, 345/77, 92
See application file for complete search history.

(56) References Cited

U.S. PATENT DOCUMENTS

| 7,499,042 | B2* | 3/2009 | Shirasaki et al. | 345/77 |
| 8,115,705 | B2* | 2/2012 | Kawabe | 345/76 |
| 2005/0110720 | A1* | 5/2005 | Akimoto et al. | 345/76 |
| 2006/0208977 | A1* | 9/2006 | Kimura | 345/77 |
| 2007/0241999 | A1* | 10/2007 | Lin | 345/77 |

FOREIGN PATENT DOCUMENTS

| JP | 2001-092413 | 4/2001 |
| JP | 2003-005703 | 1/2003 |
| JP | 2005-316110 | 11/2005 |

* cited by examiner

*Primary Examiner* — Kevin M Nguyen
(74) *Attorney, Agent, or Firm* — Antonelli, Terry, Stout & Kraus, LLP.

(57) ABSTRACT

In an image display device, each pixel includes a drive transistor for driving a light emitting element, a capacitive element which is connected between a signal line and a control electrode of the drive transistor, and a reset switching element. The reset switching elements of all pixels are turned off within a light emission period, and a PWM signal is supplied to a signal line from a drive circuit. A cycle of the PWM signal in a low brightness display mode is shorter than a cycle of the PWM signal in a standard brightness display mode. Due to such a constitution, the constitution of a drive circuit can be simplified, and it is possible to control light emission brightnesses of respective pixels of red, green and blue over a wide range from high brightness to low brightness while taking a balance among the light emission brightnesses.

17 Claims, 16 Drawing Sheets

INV

DISPLAY DEVICE

CROSS-REFERENCE TO RELATED APPLICATION

The present application claims priority from Japanese application JP 2008-208614 filed on Aug. 13, 2008, the content of which is hereby incorporated by reference into this application.

BACKGROUND OF THE INVENTION

1. Field of the Invention

The present invention relates to a display device, and more particularly to a technique which is effectively applicable to an organic EL display device which uses organic EL elements or the like.

2. Description of the Related Art

Although cathode ray tubes (CRTs) have been a mainstream of the display devices conventionally, recently, a demand for flat display devices has been increasing as display devices which replace the cathode ray tubes. Particularly, an organic EL (Electro Luminescence) display device which uses organic EL elements such as OLED (Organic Light Emitting Diodes) possesses excellent properties such as small power consumption, light weight, small thickness, excellent motion picture characteristics, and a favorable viewing angle. The development of the organic EL display devices has been in progress and some organic EL display devices have been put into practice.

These organic EL display devices are described in JP-A-2003-5703 (patent document 1), JP-A-2005-316110 (patent document 2) and JP-A-2001-92413 (patent document 3).

Patent document 1 discloses that a triangular waveform signal is used as a PWM signal within a light emission period, and the triangular waveform signal can be modified in various shapes. For example, according to patent document 1, to prevent the time-based center of gravity of emitted light from being dependent on light emitting grayscales, visual characteristics which differ from each other are acquired using a laterally symmetrical triangular waveform, an asymmetrical triangular waveform, a non-linear triangular waveform corresponding to gamma characteristic modulation, a plurality of triangular waveforms and the like.

Further, patent document 2 discloses an electro-optical device which includes a selection circuit for selecting one brightness display mode from a plurality of brightness display modes based on a result of determination made by a determination circuit. According to patent document 2, a gamma curve is suitably changed by adjusting a reference potential such as a gamma correction voltage when crushing occurs in a low brightness portion so that the grayscale difference can be easily distinguished in the low brightness portion. Patent document 2 also discloses that such processing is automatically executed by incorporating resistance capable of changing over a gamma reference power source circuit between a connection state and a disconnection state in response to a control signal and, at the same time, by programming the gamma reference power source circuit such that a main control circuit outputs a preceding control signal to lower the maximum brightness. Alternatively, patent document 2 further discloses that preceding processing may be executed corresponding to an input operation carried out by a user.

Further, respective organic EL elements which emit lights of red, green and blue which are used in an active-matrix-type organic EL display device (AM-OLED) in general differ from each other with respect to light emitting characteristics (light emitting brightness, a voltage-current characteristic, a voltage-light emitting brightness characteristic and the like) for respective colors. Such irregularities in the light emitting characteristics of the respective organic EL elements of red, green and blue also appear as the above-mentioned minute irregularities on a display screen.

To suppress the non-uniformity in display attributed to the irregularities in the light emitting characteristics of the respective organic EL elements of red, green and blue, for example, the above-mentioned patent document 3 discloses a technique which provides memories which perform gamma correction with respect to respective video signals of R, G, B which are supplied to respective organic EL elements of red, green and blue and changes gamma correction values for respective R, G, B.

SUMMARY OF THE INVENTION

There may be a case where the organic EL display device is requested to perform a display in a plurality of brightness display modes (so-called, a plurality of light emitting brightness settings). With respect to such brightness display modes, none of the above-mentioned patent documents 1 to 3 discloses or suggests an idea that grayscale characteristics which are changed corresponding to a control of a voltage of an anode power source for changing over the brightness display mode are determined such that points of inflection of PWM (Pulse Width Modulation) signals conform with predetermined grayscale characteristics.

Further, the display devices disclosed in patent document 2 and patent document 3 perform the gamma correction and hence, each display device requires an A/D converter, a D/A converter and correction memories thus giving rise to a drawback that the display devices has the complicated constitution and is costly. Still further, in patent document 3, irregularities of local characteristics such as the brightness irregularities between respective pixels are not taken into consideration and hence, the display device disclosed in patent document 3 cannot overcome the irregularities of local characteristics such as brightness irregularities between the respective pixels.

The present invention has been made to overcome such drawbacks of the related art, and it is an object of the present invention to provide, with respect to an image display device having current-driven light emitting elements such as EL elements, a technique which can simplify a drive circuit compared to a display device of the related art and, at the same time, and can control light emitting brightnesses of respective pixels of red, green and blue covering a wide range of brightness from high brightness to low brightness while taking a balance among the light emitting brightnesses.

The above-mentioned and other objects and novel technical features of the present invention will become apparent from the description of this specification and attached drawings.

A display device according to the present invention includes signal lines which input video signals to pixels each of which has a spontaneous light emitting element, and a drive circuit which supplies a video signal and a PWM signal to the signal lines. The pixel has a drive transistor which drives the spontaneous light emitting element based on a video signal, a capacitive element which is arranged between the signal line and a control electrode of the drive transistor, and a reset switching element which is arranged between the control electrode of the drive transistor and a second electrode of the drive transistor. A first electrode of the drive transistor is connected to a first power source voltage, and the other end of the spontaneous light emitting element is connected to a second power source voltage. Further, in the display device according to the present invention, one frame period includes a writing period in which the video signal is written in the pixel and a light emission period, and the reset switching element is turned off within the light emission period and the PWM signal is supplied to the signal line from the drive circuit. Further, the image display device of the present invention has two or more brightness display modes, and a cycle of the PWM signal which is supplied to the signal line from the drive circuit within a light emission period in a low brightness display mode out of two or more brightness display modes is set shorter than a cycle of the PWM signal which is supplied to the signal line from the drive circuit within the light emission period in a standard brightness display mode.

DESCRIPTION OF THE PREFERRED EMBODIMENTS

Figure 1:
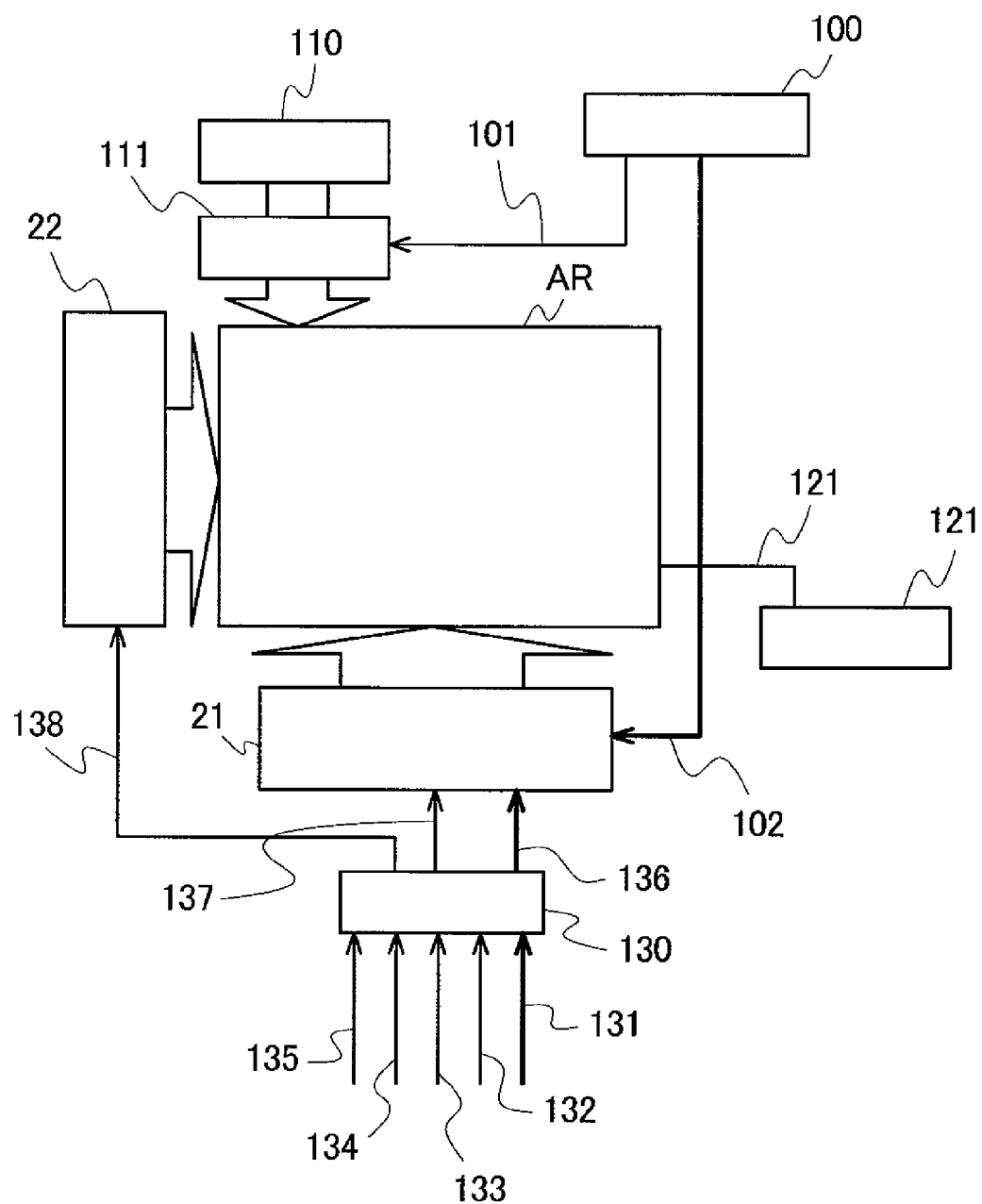
FIG. 1 is a block diagram showing the schematic constitution of an organic EL display device according to the present invention.

To briefly explain typical inventions among inventions disclosed in this specification, they are as follows.

(1) A display device includes: a plurality of pixels each of which includes a spontaneous light emitting element; a plurality of signal lines which inputs a video signal to the pixels; and a drive circuit which supplies the video signal and a PWM signal to the respective signal lines. Each pixel includes a drive transistor which drives the spontaneous light emitting element based on the video signal, a capacitive element which is arranged between the corresponding signal line among the plurality of signal lines and a control electrode of the drive transistor, and a reset switching element which is arranged between the control electrode and a second electrode of the drive transistor. A first electrode of the drive transistor is connected to a first power source voltage. The other end of the spontaneous light emitting element is connected to a second power source voltage one frame period includes a writing period in which the video signal is written in the pixel and a light emission period. Within the light emission period, the reset switching elements of all pixels are turned off and the PWM signal is supplied to the signal line from the drive circuit. The display device has two or more brightness display modes. A cycle of the PWM signal which is supplied to the signal line from the drive circuit within the light emission period in a low brightness display mode out of the above-mentioned two or more brightness display modes is shorter than a cycle of the PWM signal which is supplied to the signal line from the drive circuit within the light emission period in a standard brightness display mode.

(2) A display device includes: a plurality of pixels each of which includes a spontaneous light emitting element; a plurality of signal lines which inputs a video signal to the pixels; and a drive circuit which supplies the video signal and a PWM signal to the respective signal lines. Each pixel includes a drive transistor which drives the spontaneous light emitting element based on the video signal, a capacitive element which is connected between the corresponding signal line among the plurality of signal lines and a control electrode of the drive transistor, and a reset switching element which is connected between the control electrode and a second electrode of the drive transistor. A first electrode of the drive transistor is connected to a first power source voltage. The other end of the spontaneous light emitting element is connected to a second power source voltage one frame period includes a writing period in which the video signal is written in the pixel and a light emission period. Within the light emission period, the reset switching elements of all pixels are turned off and the PWM signal is supplied to the signal line from the drive circuit. The display device has two or more brightness display modes. The PWM signal supplied to the signal line from the drive circuit within the light emission period has at least one or more inflection points for making the inclination of the PWM signal different before and after the inflection point, and the position of the inflection point differs for every brightness display mode out of the above-mentioned two or more brightness display modes.

(3) In the display device having the constitution (2), the drive transistor is operated in a saturated region within the light emission period with respect to a high brightness display modes out of two or more brightness display modes.

(4) In the display device having the constitution (2), the plurality of pixels includes a group of pixels of first color, a group of pixels of second color and a group of pixels of third color, and positions of inflection points of the PWM signal differ from each other for the pixels of every color.

(5) A display device includes: a plurality of pixels each of which includes a spontaneous light emitting element; a plurality of signal lines which inputs a video signal to the pixels; and a drive circuit which supplies the video signal and a PWM signal to the respective signal lines. Each pixel includes a drive transistor which drives the spontaneous light emitting element based on the video signal, a capacitive element which is connected between the corresponding signal line among the plurality of signal lines and a control electrode of the drive transistor, and a reset switching element which is connected between the control electrode and a second electrode of the drive transistor. A first electrode of the drive transistor is connected to a first power source voltage. The other end of the spontaneous light emitting element is connected to a second power source voltage one frame period includes a writing period in which the video signal is written in the pixel and a light emission period. The reset switching elements of all pixels are turned off within the light emission period so that the PWM signal is supplied to the signal line from the drive circuit. The display device has two or more brightness display modes. The drive transistor is operated in a saturated region within the light emission period in a high brightness display mode out of two or more brightness display modes, and the PWM signal which is supplied to the signal lines from the drive circuit within the light emission period is a PWM signal having a trapezoidal waveform.

(6) In the display device having any one of the constitutions (1) to (5), the predetermined brightness display mode is selected out of the two or more brightness display modes corresponding to brightness of an external light.

(7) In the display device having any one of the constitutions (1) to (6), each pixel includes a lighting control switching element which is connected between the second electrode of the drive transistor and one end of the spontaneous light emitting element, and the lighting control switching element is turned on within the light emission period.

To briefly explain an advantageous effect which is obtained by the typical invention among the inventions disclosed in this application, they are as follows.

According to the present invention, in the display device having current-driven-type light emitting elements such as EL elements, the constitution of the drive circuit can be simplified more compared to a conventional display device. Further, it is possible to control light emission brightnesses of respective pixels of red, green and blue in a wide range from high brightness to low brightness while taking a balance among the light emitting brightnesses.

Hereinafter, an embodiment of the present invention is explained in detail in conjunction with drawings.

Here, in all drawings for explaining the embodiment, parts having identical functions are given same symbols and their repeated explanation is omitted.

[Schematic Constitution of Organic EL Display Device According to the Present Invention]

FIG. 1 is a block diagram showing the schematic constitution of an organic EL display device according to the present invention.

In FIG. 1, symbol AR indicates a display part, numeral 21 indicates a signal line drive circuit, numeral 22 indicates a scanning line drive circuit, numeral 100 indicates a brightness display mode control part, numeral 110 indicates an anode power source part, numeral 111 indicates a power source control part, and numeral 130 indicates a display control part.

Numeral 131 indicates video data signals which constitute video digital signals inputted from the outside and express contrast values of respective pixels of an image. Numeral 132 indicates a vertical synchronizing signal (VSYNC) which is a signal generated in accordance with one display screen cycle (1 frame) and also is a signal which indicates starting of video data signals for 1 frame.

Numeral 133 indicates a horizontal synchronizing signal (HSYNC) which is a signal generated in accordance with 1 horizontal cycle and is a signal which indicates starting of display data digital signals for 1 horizontal line. Numeral 134 indicates a data enable signal which is a signal expressing a period during which the video data signal is effective.

All of the video data signals 131, the vertical synchronizing signal 132, the horizontal synchronizing signal 133, and the data enable signal 134 are inputted in synchronism with a data synchronizing clock 135.

In this embodiment, the explanation is made hereinafter assuming that the video data signals 131 for one screen are sequentially transferred from the pixel on a left upper end of the screen in a raster scanning method.

The display control part 130 is a part for controlling the whole organic EL display device, and outputs display data 136, signal line drive circuit control signals 137 and scanning line drive circuit control signals 138 at predetermined timings in response to the video data signals 131, the vertical synchronizing signal 132, the horizontal synchronizing signal 133, data enable signal 134 and the data synchronizing clock 135 which are inputted to the display control part 130 from the outside.

The signal line drive circuit 21 is controlled in response to the signal line drive circuit control signal 137, and writes video signals in respective pixels within the display part using an analog signal via the signal lines.

The scanning line drive circuit 22 is controlled in response to the scanning line drive circuit control signal 138 and transmits a writing selection signal to the display part AR via a reset line and a lighting switch line.

The anode power source part 110 is an anode-side power source for organic EL elements. The anode power source part 110 supplies electricity necessary for allowing the organic EL element to emit light to the display part AR.

The brightness display mode control part 100 is installed from the outside, and the brightness display mode control part 100 outputs a voltage control signal 101 to the power source control part 111 and outputs a light emission period control signal 102 to the signal line drive circuit 21.

The power source control part 111 supplies a preset drive voltage for the organic EL elements to the display part AR corresponding to various kinds of brightness display modes. Here, the brightness display mode control part 100 may automatically select a predetermined brightness display mode out of two or more brightness display modes corresponding to brightness of an external light.

The signal line drive circuit 21 controls actual display brightnesses (that is, grayscale characteristics) with respect to grayscales of the video signals which are inputted to the organic EL display device. A cathode power source part 120 is connected to cathode sides of the organic EL elements of respective pixels within the display part via a cathode power source line 121.

Figure 2:
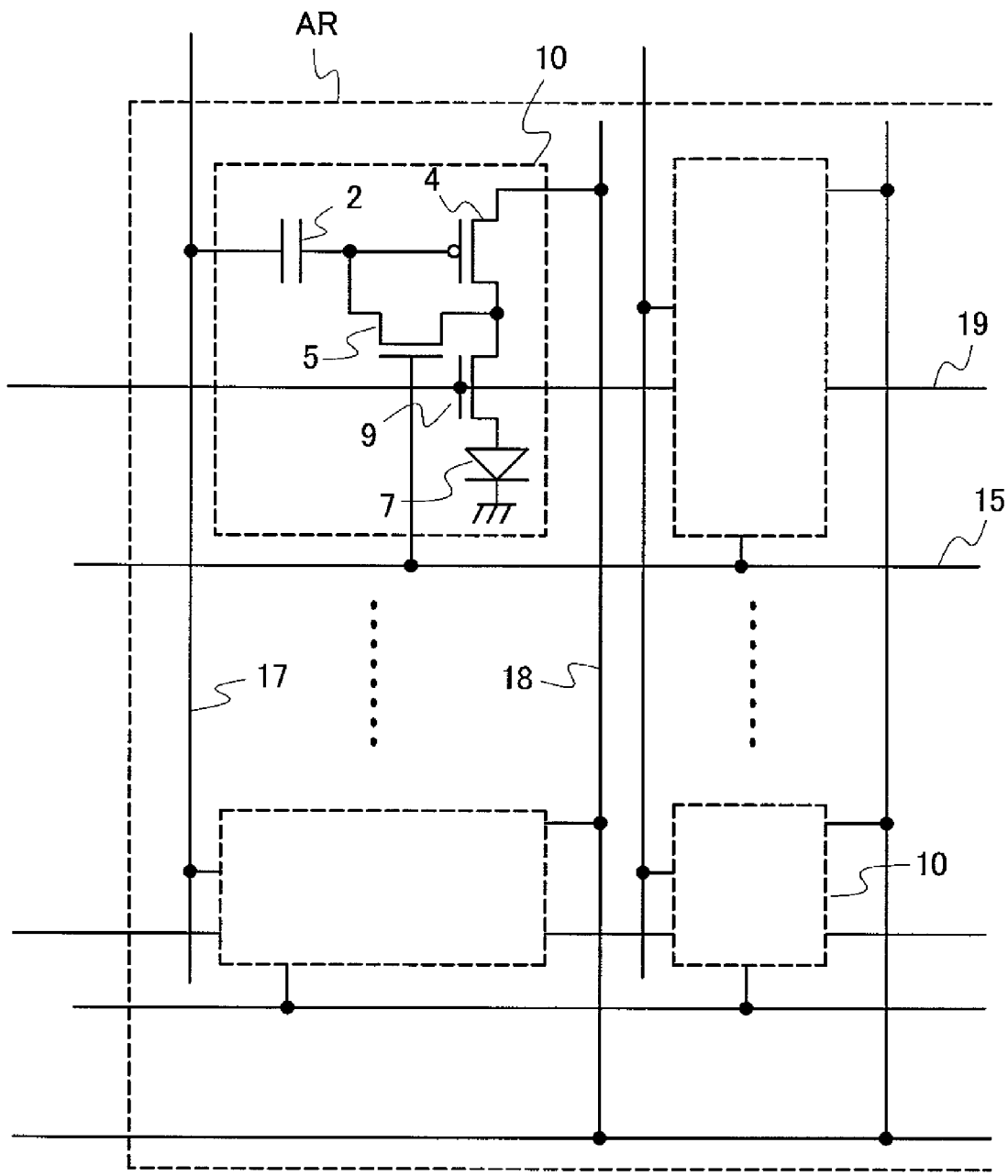
FIG. 2 is a view showing the whole constitution of a display part of the organic EL display device shown in FIG. 1.

FIG. 2 is a view showing the whole constitution of the display part AR of the organic EL display device shown in FIG. 1. As shown in FIG. 2, a plurality of pixels 10 is arranged within a display region of the organic EL display panel in a matrix array.

To the pixel 10, a signal line 17, the reset line 15, the lighting switch line 19, and the power source line 18 are respectively connected. The reset line 15 and the lighting switch line 19 are connected to the scanning line drive circuit 22.

Video signals and the PWM signals are inputted to the signal line 17 from the signal line drive circuit 21.

Although a large number of pixels 10 are arranged within the display region of the organic EL display device in an actual display device, only four pixels are shown in FIG. 2 to simplify the drawing.

Each pixel 10 includes an organic electro luminescence element (hereinafter, referred to as an organic EL element) 7 as a light emitting element, and a cathode electrode of the organic EL element 7 is connected to the cathode power source line 121.

The anode electrode is connected to the power source line 18 via a lighting switching element 9 constituted of an n-type thin film transistor and a p-type thin film transistor (hereinafter, referred to as a drive TFT) 4.

A capacitance element 2 is connected between a gate electrode and a source electrode of the drive TFT 4, and a reset switching element 5 which is constituted of a thin film transistor is arranged between a drain electrode and the gate electrode of the drive TFT 4.

A gate electrode of the reset switching element 5 is connected to the reset line 15, while a gate electrode of the lighting switching element 9 is connected to the lighting switch line 19.

All of respective circuits constituted of the pixels 10, the scanning line drive circuit 22, the signal line drive circuit 21 and the like are formed of a generally well-known low-temperature polycrystalline-silicon thin film transistor having a low-temperature polycrystalline-silicon layer as a semiconductor layer. The respective thin film transistors are formed on a glass substrate.

With respect to a manufacturing method of the low-temperature polycrystalline-silicon thin film transistors and a manufacturing method of the organic EL elements 7, these methods are not substantially different from generally-known corresponding manufacturing methods and hence, the explanation of these manufacturing methods is omitted here.

Figure 3:
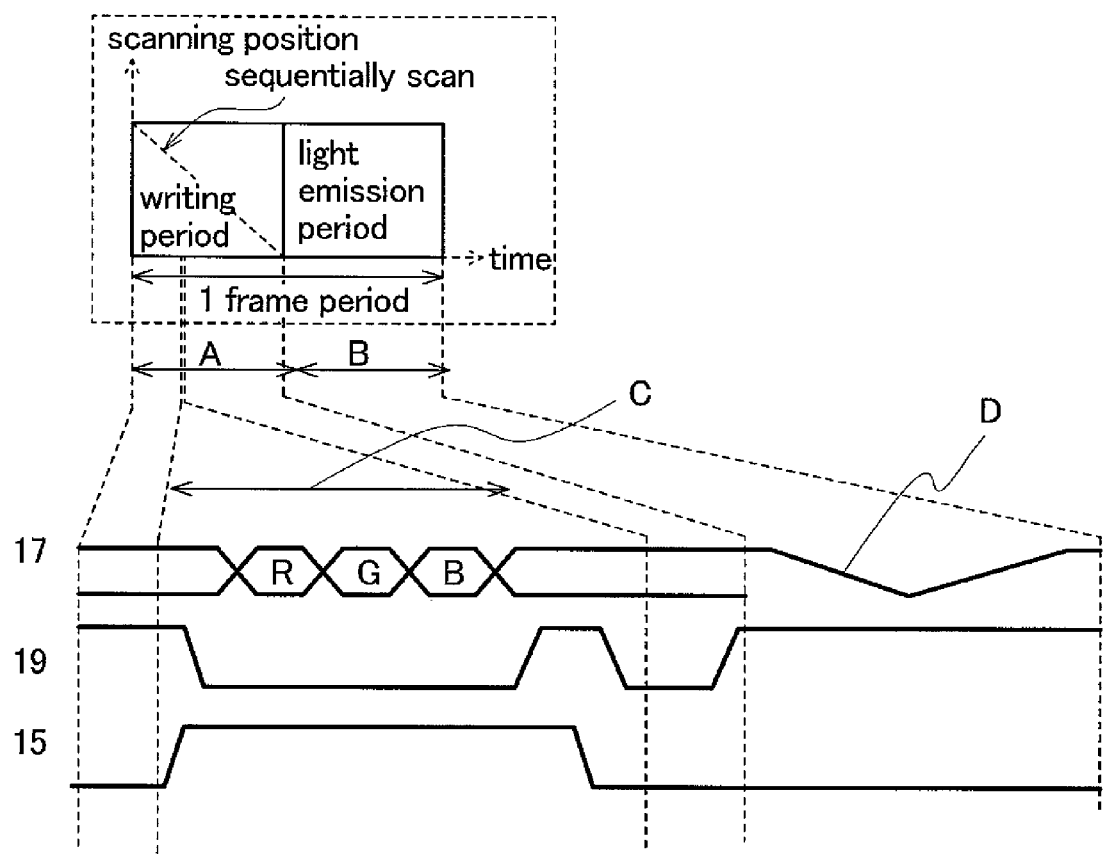
FIG. 3 is a timing chart for explaining the manner of operation of the organic EL display device according to the present invention.

FIG. 3 is a timing chart for explaining the manner of operation of the organic EL display device according to the present invention.

As shown in FIG. 3, in the organic EL display device according to this embodiment, each pixel includes a writing period (a period indicated by A in FIG. 3) and a light emission period (a period indicated by B in FIG. 3) within 1 frame period, a video signal is written in each pixel 10 within the writing period, and the pixel is lit within the light emission period to perform a display.

Writing of the video signal is performed in accordance with every 1 display line, that is, in accordance with every reset line 15. Here, the number of pixels in a display part AR of the organic EL display device of this embodiment is 640× 480×3 and hence, the explanation is made hereinafter assuming that the number of reset lines 15 is 480 ranging from a first reset line to a 480th reset line in the vertical direction, and the number of signal lines 17 is 640 ranging from a first signal line, a second signal line to a 640th signal line for respective pixels of R, G and B in the horizontal direction.

Further, the explanation is made hereinafter assuming that the number of power source lines 18 is 640 ranging from a first power source line, a second power source line to a 640th power source line for respective pixels of R, G and B in the horizontal direction.

Hereinafter, a manner of operation of a driving method of the organic EL display device of this embodiment in respective periods is explained.

[Writing Period]

In the writing period, as indicated by C shown in FIG. 3, the scanning line drive circuit 22 sequentially scans a plurality of pixels 10 in each row in accordance with every 1 display line, and writes video signals from the signal line drive circuit 21 into the signal lines 17 in synchronism with such sequential scanning.

Hereinafter, an operation of the pixels 10 on an arbitrary display line selected by the scanning line drive circuit 22 during "writing period" is explained.

Within the writing period, a video voltage is supplied to the signal line 17 from the signal line drive circuit 21.

First of all, the reset line 15 and the lighting switch line 19 assume a High level (hereinafter referred to as "H level") and hence, the reset switching element 5 and the lighting switching element 9 are turned on. Accordingly, in the drive TFT 4, the gate electrode and the drain electrode are connected to each other by diode connection.

Next, when the lighting switch line 19 assumes a Low level (hereinafter referred to as "L level") and the lighting switching element 9 is turned off, the drive TFT 4 and the organic EL element 7 are forcibly brought into a current OFF state. Here, the gate electrode and the drain electrode of the drive TFT 4 are short-circuited by the reset switching element 5 and hence, a voltage of the gate electrode of the drive TFT 4 which also constitutes one end of the capacitive element 2 is automatically reset to a voltage (Vdd−Vth) which is lower than a voltage (Vdd) of the power source line 18 by a threshold voltage (Vth). Here, as mentioned previously, the video signal is inputted to the other end of the capacitive element 2 from the signal line 17.

Figure 4:
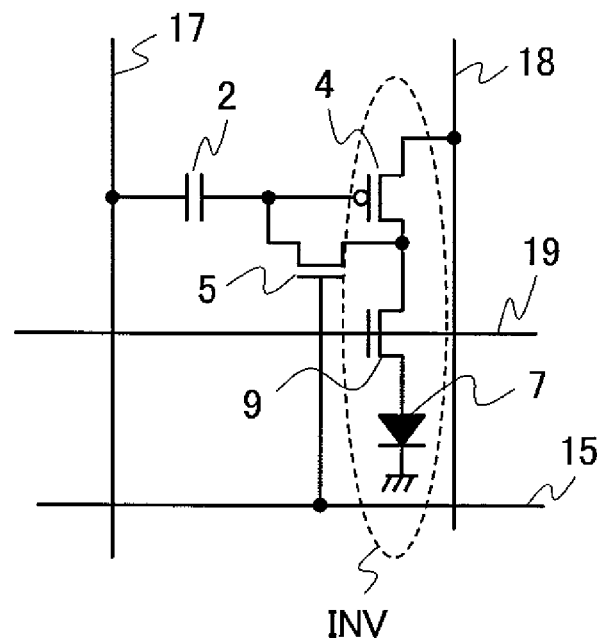
FIG. 4 is a view for explaining one pixel shown in FIG. 1.

That is, as shown in FIG. 4, an input and an output of a drive inverter (INV) which is constituted of the drive TFT 4 and the organic EL element 7 are short-circuited and hence, a reference voltage (Vref) which conforms with the characteristic of the drive TFT 4 which constitutes the drive inverter (INV) of each pixel is set, and the video voltage from the signal line 17 is stored in the capacitive element 2 using the reference voltage as the reference.

The drive inverter (INV) performs a light emission time control of the organic EL element 7 in accordance with a video voltage as follows. That is, the drive inverter (INV) brings the organic EL element 7 into an OFF state when a triangular waveform PWM signal inputted within the light emission period after the writing period is higher than the video voltage stored in the capacitive element 2, and brings the organic EL element 7 into an ON state when the triangular waveform PWM signal inputted within the light emission period after the writing period is lower than the video voltage stored in the capacitive element 2.

Figure 5:
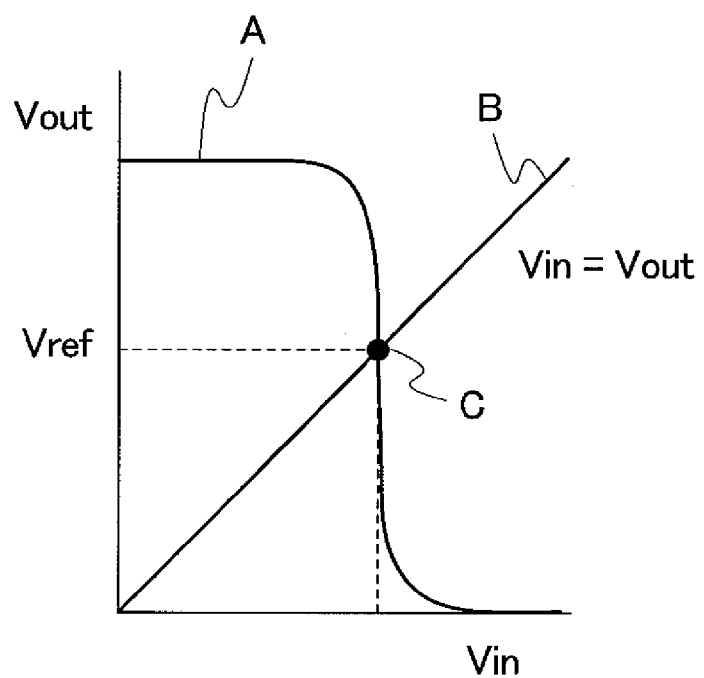
FIG. 5 is a view for explaining the setting of a reference voltage of a signal voltage in a drive inverter (INV) shown in FIG. 4.

FIG. 5 is a view for explaining the setting of the reference voltage with respect to the signal voltage in the drive inverter (INV) shown in FIG. 4.

In FIG. 5, symbol A indicates an input/output characteristic of the drive inverter (INV), and symbol B indicates an input/output short-circuiting condition. An intersecting point C of a curve indicated by A and a straight line indicated by B is a video voltage writing reference potential (Vref) of the drive inverter (INV).

The drive TFT 4 has the input and the output thereof short-circuited at the time of writing the video signal and hence, the potential of the input and the output of the drive TFT 4 becomes the video voltage writing reference potential (Vref) which is the intersecting point C of the input/output characteristic and the input/output short-circuiting condition indicated by the straight line. Writing of the video voltage is performed using the video voltage writing reference potential (Vref) as the reference.

[Light Emitting Period]

In the light emitting period, the scanning line drive circuit 22 is stopped, the reset lines 15 assume an L level, and the lighting switch lines 19 assume an H level and hence, the reset switching elements 5 of all pixels are turned off and the lighting switching elements 9 of all pixels are turned on.

Here, a triangular waveform PWM signal indicated by D in FIG. 3 is inputted to the signal lines 17 from the signal line drive circuit 21.

When a voltage of the triangular waveform PWM signal is higher than a video voltage stored in the capacitive element 2, the organic EL elements 7 assume an OFF state. On the other hand, when the voltage of the triangular waveform PWM signal is lower than the video voltage stored in the capacitive element 2, the organic EL elements 7 assume an ON state.

In this embodiment, the drive TFT 4 and the organic EL element 7 are connected to each other via the lighting switching element 9. However, the display device can acquire the substantially same advantageous effect even when the lighting switching element 9 is not provided.

Peripheral drive circuits including the scanning line drive circuit 22, the signal line drive circuit 21 and the like may be formed of a low-temperature polycrystalline-silicon (poly-silicon) thin film transistor. However, these peripheral drive circuits or some of these peripheral drive circuits which are mounted on the display device may be formed of a single-crystalline LSI (Large Scale Integrated) circuit. In this case, the drive TFTs 4, the reset switching elements 5, the lighting switching elements 9 and the like may be respectively formed on a glass substrate using an amorphous silicon thin film transistor which includes a semiconductor layer made of amorphous silicon.

Figure 6:
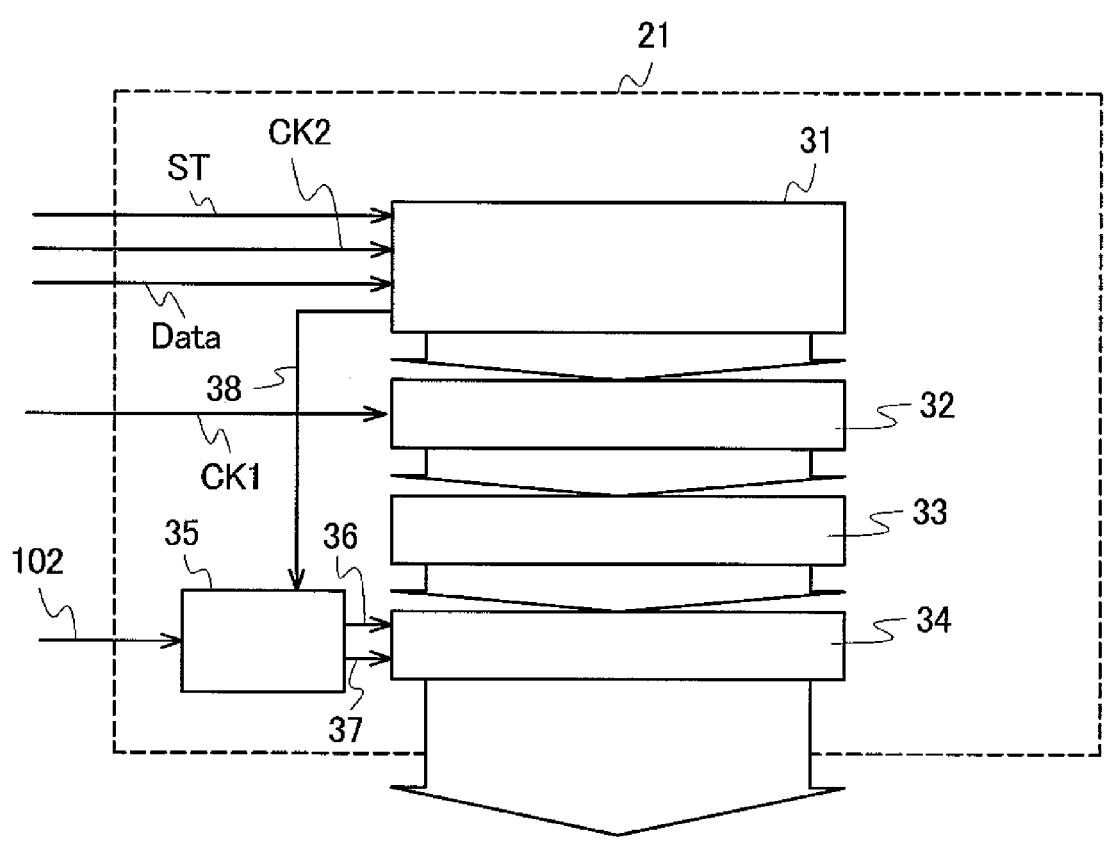
FIG. 6 is a schematic block diagram showing the internal constitution of a signal line drive circuit shown in FIG. 1.

FIG. 6 is a schematic block diagram showing the internal constitution of the signal line drive circuit 21 shown in FIG. 1.

In FIG. 6, a data shift means 31 fetches, in response to a data clock CK2, display input serial data Data (display data 136 shown in FIG. 1) for one line within one horizontal period using a data start signal ST as the reference for starting data fetching, and outputs the serial data Data as shift data.

A 1 line latch means 32 latches the shift data for 1 line, and outputs the shift data as 1 line latch data in synchronism with a horizontal latch clock CK1.

Here, the data clock CK2, the data start signal ST and the horizontal latch clock CK1 are signals which are contained in the signal line drive circuit control signals 137 shown in FIG. 1. Further, the display input serial data Data for 1 line corresponds to the display data 136 in FIG. 1.

A grayscale voltage selection means 33 selects a voltage at one level out of grayscale voltages at 256 levels in accordance with 1 line latch data, and outputs the voltage at one level as a video signal for 1 line.

A triangular waveform generating means 35 generates and outputs a triangular waveform PWM signal 36 irrelevant to the input display data within the light emission period in accordance with a light emission period control signal 102 and a retracing period signal 38. The triangular waveform generating means 35 also generates a triangular switching signal 37 which indicates a period in which the triangular waveform PWM signal 36 is outputted to the signal lines 17.

A grayscale voltage-triangular waveform switching means 34 changes over the video signal for 1 line and the triangular waveform PWM signal in accordance with the triangular switching signal 37 and outputs the switched signal to the signal lines 17.

Figure 7:
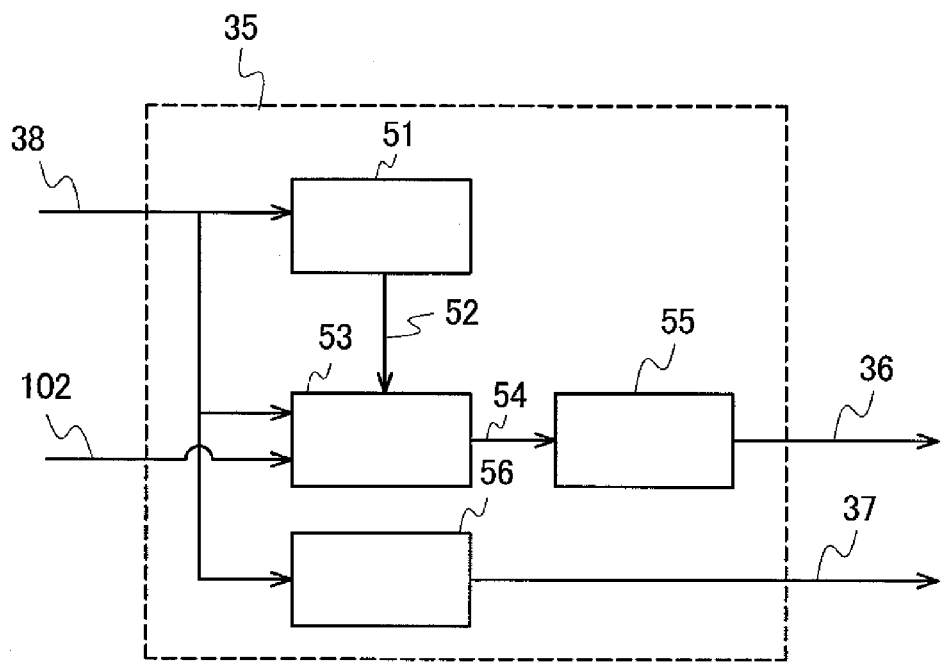
FIG. 7 is a schematic block diagram showing the internal constitution of a triangular-wave generating means shown in FIG. 6.

FIG. 7 is a schematic block diagram showing the internal constitution of the triangular waveform generating means 35 shown in FIG. 6.

A reference clock generating means 51 generates a reference clock 52 for generating the triangular waveform PWM signal.

An up-down counting means 53 performs a count-down operation from an initial value to "0" and, thereafter, a count-up operation again until the count returns to the initial value again from "0" in synchronism with the reference clock 52 based on a control of a light emission period control signal 102 and a retracing period signal 38, and outputs a count output 54.

A digital/analogue converting means 55 applies digital/analogue conversion to the count output 54 which is digital data, and outputs the triangular waveform PWM signal 36.

In the circuit shown in FIG. 7, the up-down counting means 53 is of a counter of 8 bits, wherein an initial value at the time of starting counting is set to "255". The digital/analogue converting means 55 is also compatible with digital data of 8 bits.

A triangular waveform switching signal generating means 56 generates a triangular waveform switching signal 37 based on the retracing period signal 38.

Figure 8:
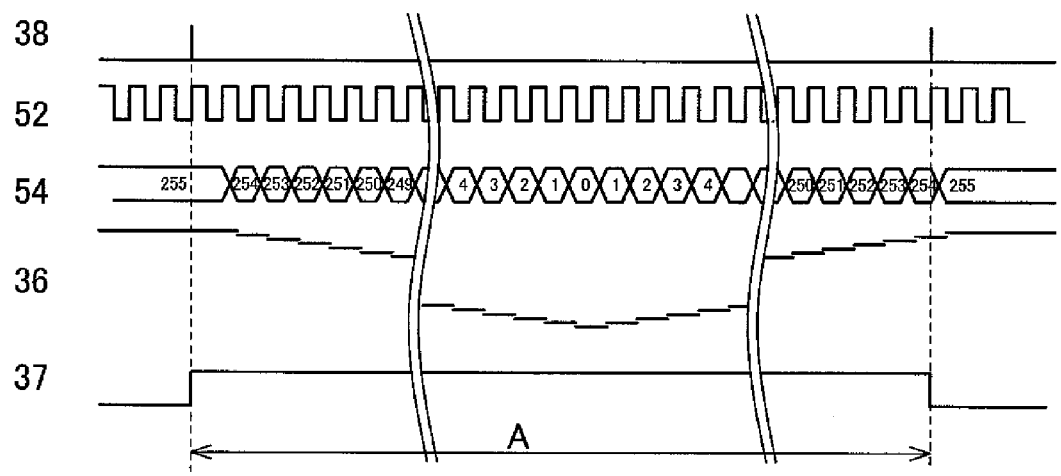
FIG. 8 is a timing chart for explaining the manner of operation of the triangular-wave generating means in FIG. 7.

FIG. 8 is a timing chart for explaining the manner of operation of the triangular waveform generating means 35 in FIG. 7.

In FIG. 8, the reference clock 52 is a clock having at least the number of cycles necessary for allowing the up-down counting means 53 to perform the count-down operation from the initial value "255" to "0" and, thereafter, to perform the count-up operation from "0" to "255" again within a triangular waveform period from input display data finish timing to input display data start timing (a period A between the retracing period signals 38 in FIG. 8).

The count output 54 outputted from the up-down counting means 53 is an output value which, in accordance with the reference clock 52, performs the count-down operation from the initial value "255" and, after the count becomes "0", performs the count-up operation to "255" which is the initial value again.

The triangular waveform PWM signal 36 outputted from the digital/analogue converting means 55 is a signal acquired by converting the count output 54 which is 8-bit digital data ranging from "0" to "255" into an analogue signal, wherein the PWM signal 36 assumes a lowest level when the count output 54 is "0" and the PWM signal 36 assumes a highest level when the count output 54 is "255".

Embodiment

The present invention is characterized in that a brightness display is changed over among a plurality of brightness display modes by the brightness display mode control part 100. Here, a PWM signal having an optimum waveform is used corresponding to each brightness display mode.

Figure 9A:
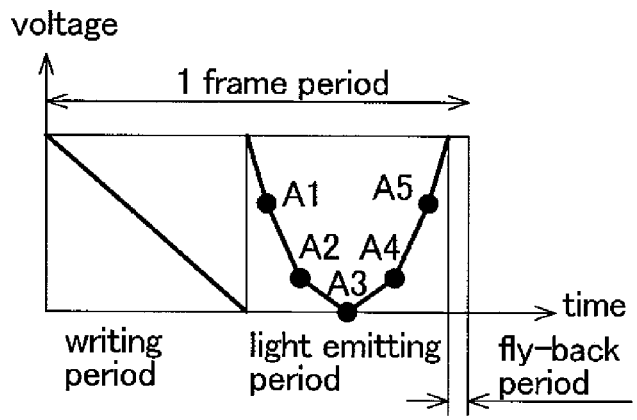
FIG. 9A is a view for explaining a PWM signal when the organic EL display device according to an embodiment of the present invention is in a standard brightness display mode.

FIG. 9A is a view for explaining a PWM signal when the organic EL display device according to the embodiment is in a standard brightness display mode. In FIG. 9A to FIG. 9D, the writing period is a period in which a video signal is written in respective pixels for every 1 display line (or for every 2 display lines).

In the standard brightness display mode of this embodiment, as shown in FIG. 9A, within the light emission period, in place of a PWM signal having a triangular waveform (for example, a waveform indicated by D in FIG. 3), a PWM signal having a waveform similar to a parabolic waveform having inflection points A1 to A5 is used. In the present invention, the inflection point implies a point which functions as a border where the inclination of a straight line differs.

In this embodiment, the PWM signal having the waveform similar to the parabolic waveform having the inflection points is used and the optimum inflection points are set corresponding to respective brightness display modes and hence, it is possible to perform optimum brightness controls corresponding to the respective brightness display modes. Further, in this embodiment, by setting the inflection points for respective pixels of red, green and blue, for example, it is possible to adjust a balance among light emission brightnesses of respective pixels of red, green and blue. Still further, in this embodiment, by properly setting the inflection points of the PWM signal, it is also possible to perform the gamma adjustment. However, in this case, it is necessary to supply PWM signals which differ from each other for respective pixels of red, green and blue and hence, it is necessary to separate signal lines 17 for supplying the PWM signals for respective pixels of red, green and blue.

In generating the PWM signal shown in FIG. 9A, for example, a plurality of clock generating circuits which differ in cycle from each other may be provided to the reference clock generating means 51 shown in FIG. 7, and the reference clocks may be properly switched corresponding to the number of counts and may be outputted from the reference clock generating means 51 shown in FIG. 7. Due to such a constitution, the PWM signal can be easily generated.

Figure 10A:
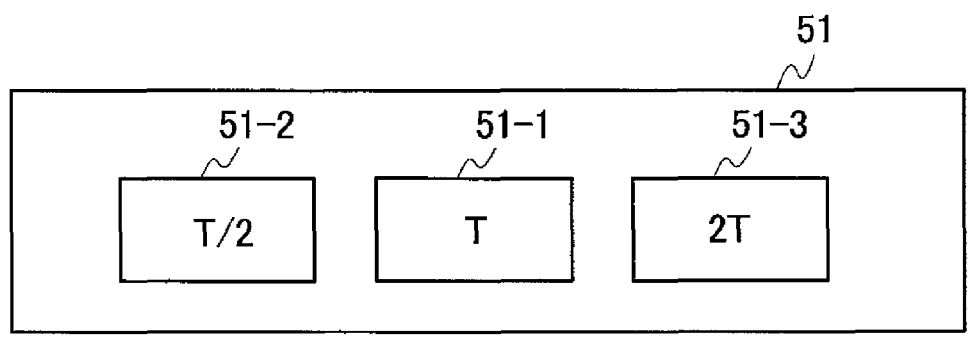
FIG. 10A is a view showing the circuit constitution for generating the PWM signal shown in FIG. 9A.

For example, as shown in FIG. 10A, to the reference clock generating means 51 shown in FIG. 7, a clock generation circuit 51-1 which generates a clock having a cycle T, a clock generation circuit 51-3 which generates a clock having a cycle (2T) twice as large as the cycle of the clock generation circuit 51-1, and a clock generation circuit 51-2 which generates a clock having a cycle (T/2) ½ times as large as the cycle of the clock generation circuit 51-1 are provided.

Figure 10B:
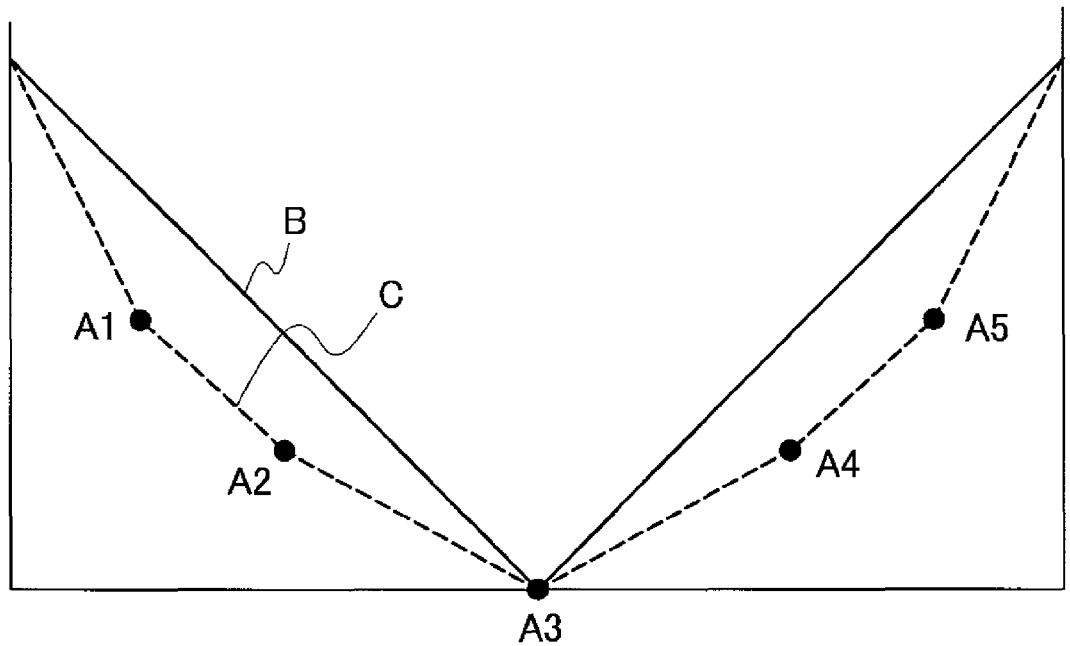
FIG. 10B is a view for explaining the triangular waveform PWM signal.

Here, by repeating the count-up and count-down with the number of counts set to 16 using the clock outputted from the clock generation circuit 51-1, it is possible to acquire a PWM signal having a triangular waveform indicated by B in FIG. 10B.

On the other hand, by repeating the count-up and count-down with the number of counts set to 16 using a clock outputted from the clock generation circuit 51-2 when the count number is 1 to 4, using a clock outputted from the clock generation circuit 51-1 when the count number is 5 to 6, using a clock outputted from the clock generation circuit 51-3 when the count number is 7 to 10, using a clock outputted from the clock generation circuit 51-1 when the count number is 11 to 12, and using a clock outputted from the clock generation circuit 51-2 when the count number is 13 to 16, it is possible to acquire a PWM signal having a waveform similar to a parabolic waveform having inflection points A1 to A5 indicated by C in FIG. 10B.

Figure 9B:
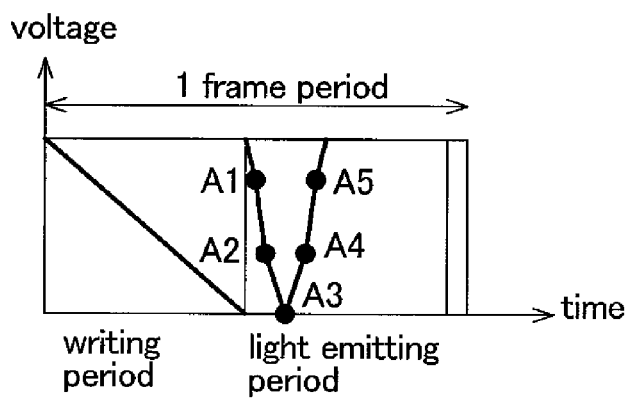
FIG. 9B is a view for explaining a PWM signal when the organic EL display device according to the embodiment of the present invention is in a low brightness display mode.

FIG. 9B is a view for explaining a PWM signal when the organic EL display device according to the embodiment is in a low brightness display mode.

As shown in FIG. 9B, the PWM signal in the low brightness display mode of this embodiment is, in the same manner as the PWM signal shown in FIG. 9A, a PWM signal having a waveform similar to a parabolic waveform having inflection points A1 to A5. However, compared to the PWM signal shown in FIG. 9A, a cycle of the PWM signal is approximately half of the cycle of the PWM signal shown in FIG. 9A. By adopting such a PWM signal, a period from writing of a video signal to light emission becomes short and hence, this embodiment can acquire the optimum waveform for low brightness control.

Here, the PWM signal shown in FIG. 9B can be easily generated, for example, by shortening the cycle (T) in the clock generation circuit 51-1, the clock generation circuit 51-2 and the clock generation circuit 51-3 shown in FIG. 10A (alternatively, setting frequency of the clock generated in the clock generating circuit 51-1 to high frequency).

Figure 9C:
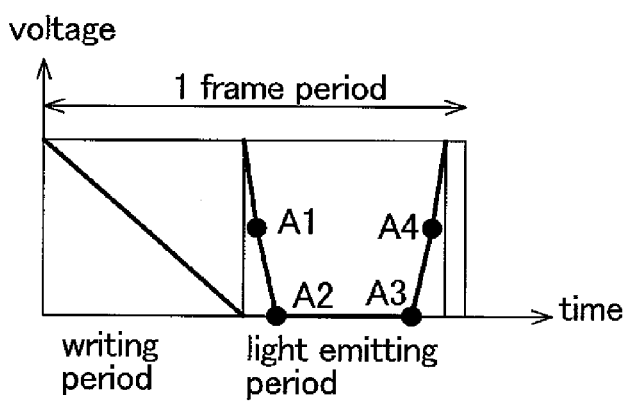
FIG. 9C is a view for explaining a PWM signal when the organic EL display device according to the embodiment of the present invention is in a high brightness display mode.

FIG. 9C is a view for explaining a PWM signal when the organic EL display device according to the embodiment is in a high brightness display mode.

As shown in FIG. 9C, the PWM signal in a high brightness display mode of the organic EL display device of this embodiment includes inflection points A1 to A4, and is a PWM signal having a waveform similar to a rectangular waveform. Further, in the high brightness display mode, the drive TFT4 is operated in a saturated region.

As mentioned above, assuming Vdd as a voltage of the power source line 18, Vdata as a voltage of the video signal, and Vds as a source-drain voltage of the drive TFT 4, the drive TFT 4 is operated in the saturated region when the following formula (1) is satisfied.

$$(Vdd-Vdata) \leq Vds \quad (1)$$

Figure 11:
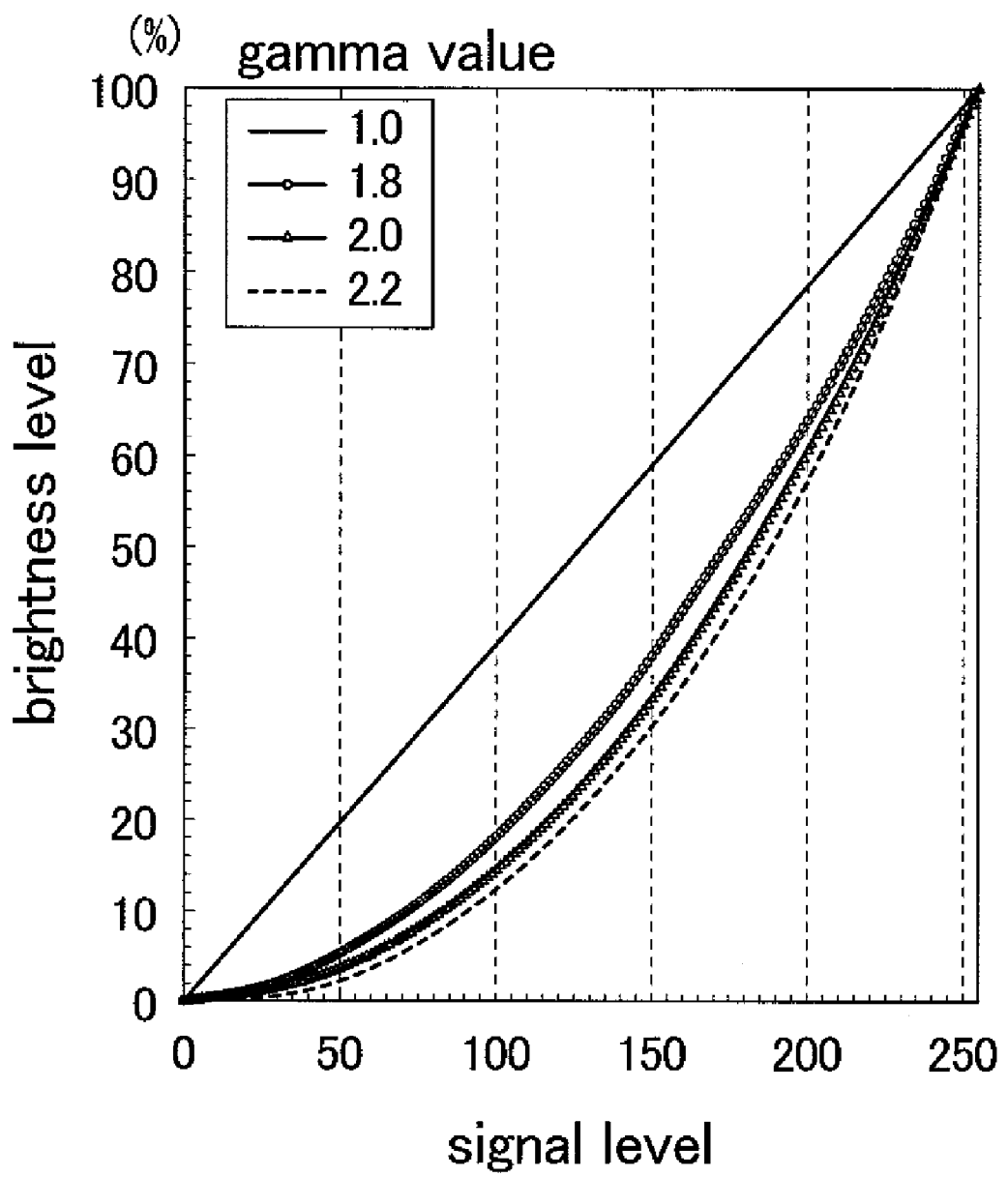
FIG. 11 is a graph showing a relationship between a signal level of the video signal and a brightness level when a gamma value is 1.0, 1.8, 2.0 and 2.2.

When the drive TFT 4 is operated in the saturated region, a drain current (ID) is proportional to a square value of the gate-source voltage of the drive TFT 4 and hence, the gamma adjustment can be performed easily. FIG. 11 shows a graph showing the relationship between a signal level of a video signal and a brightness level when a gamma value is 1.0, 1.8, 2.0 and 2.2.

In generating the PWM signal shown in FIG. 9C, an up-down control signal which is used for controlling an down operation of the up-down counting means 53 may be inputted at the time of starting the down operation and at the time of conducting the up operation by the up-down counting means 53 based on the light emission period control signal 102.

Figure 9D:
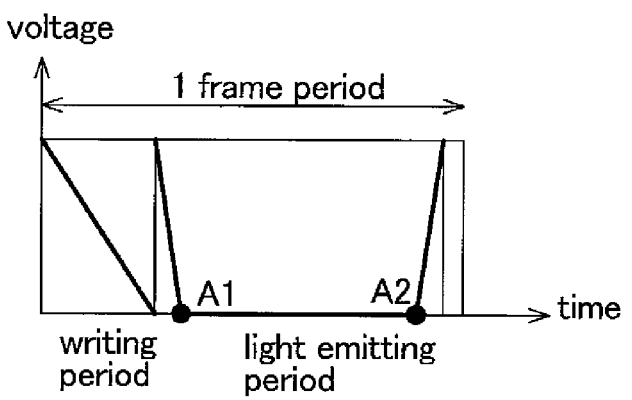
FIG. 9D is a view for explaining a PWM signal when the organic EL display device according to the embodiment of the present invention is in a maximum brightness display mode.

FIG. 9D is a view for explaining a PWM signal when the organic EL display device according to the embodiment is in a maximum brightness display mode.

As shown in FIG. 9D, the PWM signal in a maximum brightness display mode of the organic EL display device of this embodiment includes inflection points A1 and A2, and is a PWM signal having a trapezoidal waveform closer to a rectangular waveform than the PWM signal shown in FIG. 9C. Further, also in this maximum brightness display mode, the drive TFT 4 is operated in a saturated region.

As shown in FIG. 9D, in the maximum brightness display mode, for example, due to interlace driving, a writing period of a video signal becomes half of the writing period of a video signal in a high brightness display mode shown in FIG. 9C. Accordingly, it is possible to display the image having higher brightness in the maximum brightness display mode compared to the high brightness display mode shown in FIG. 9C.

In this interlace driving, writing of a video signal to pixels on the odd-numbered display line and writing of a video signal to pixels on the even-numbered display line are alternately performed for every 1 frame.

For example, in the odd-numbered frame, the video signal is written in the pixels on the odd-numbered display line, while in the even-numbered frame, the video signal is written in the pixels on the even-numbered display line.

In the present invention, "organic EL element" implies an element having the structure which constitutes one sub pixel where an organic light emission layer is sandwiched between a cathode electrode and an anode electrode.

"Organic EL display panel" implies a substrate on which the organic EL elements each of which constitutes the sub pixel are mounted. Here, "organic EL display panel" also includes the structure in which driver ICs are mounted on a substrate (a mounting method being chip-on-glass (COG), tape carrier package (TCP), chip-on-film (COF) or the like), the structure in which drivers are incorporated into a substrate using thin film transistor in which a semiconductor layer is made of poly-silicon, and the structure in which driver ICs are sealed by a sealing substrate.

"Organic EL display device" implies, besides an organic EL display panel, the structure which includes interfaces such as a timing control circuit for controlling drivers of the organic EL display panel, a power source circuit and the like.

Figure 12:
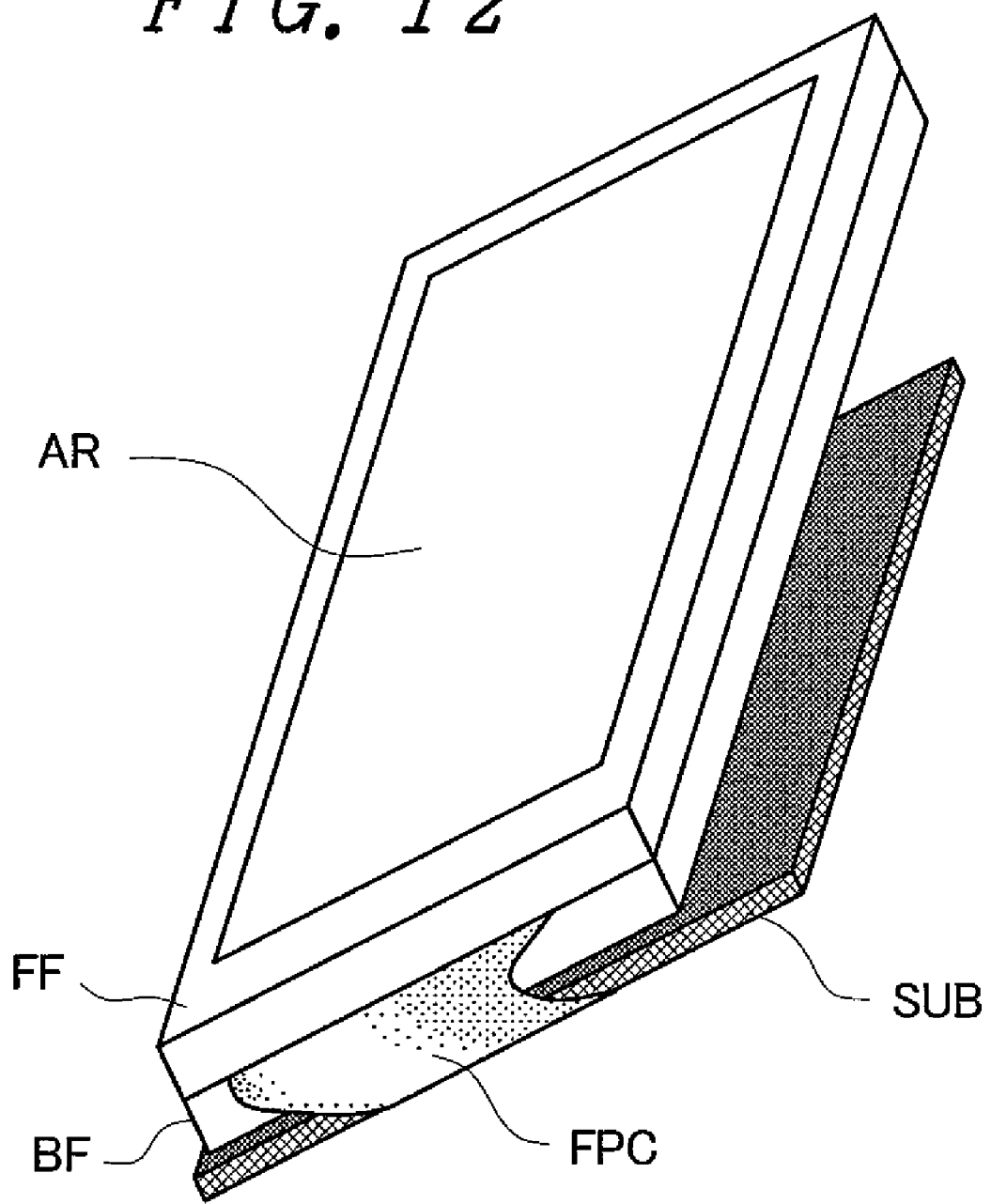
FIG. 12 is a view showing an appearance of the organic EL display device.

FIG. 12 shows an appearance of the organic EL display device.

The organic EL display device shown in FIG. 12 includes a front frame (FF) having an opening from which a display part AR of the organic EL display panel (hereinafter, also simply referred to as a panel) is exposed, a rear frame (RF) which covers the whole rear surface of the organic EL display panel and is fixed to the front frame (FF) by snap fitting, and a flexible printed circuit board (FPC) which is provided between a printed circuit board (SUB) further arranged on a rear surface of the rear frame (RF) and the organic EL display panel.

Here, the printed circuit board (SUB) may be fixed to the rear frame (RF) using an adhesive agent or a double-side coated tape. Further, the printed circuit board (SUB) may be fixed to a frame of an electronic device provided to an outer side of the rear frame using screws or the like.

Figure 13:
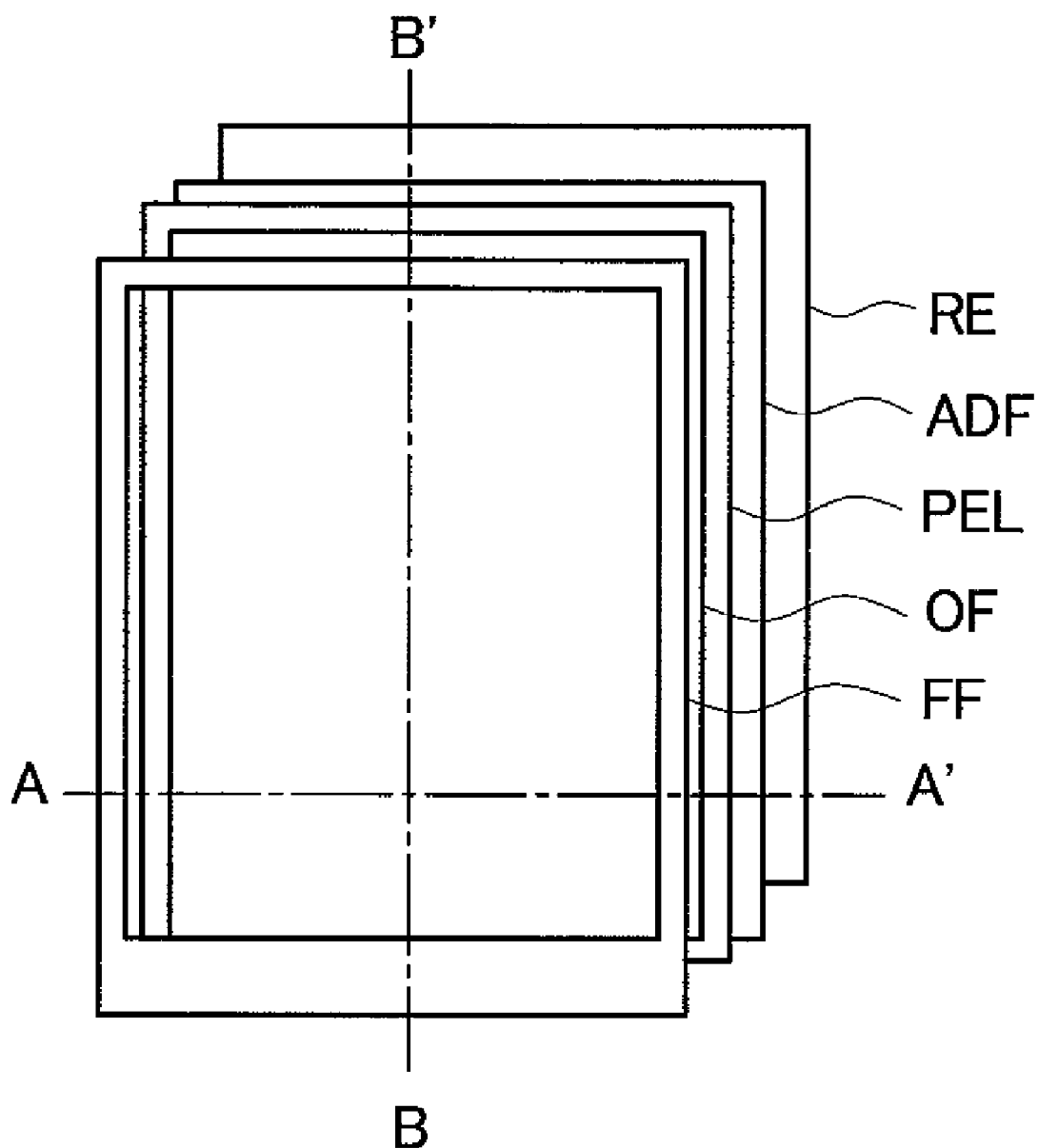
FIG. 13 is an exploded view of an organic EL display panel as viewed from an oblique upper side of a display screen.
Figure 14A:
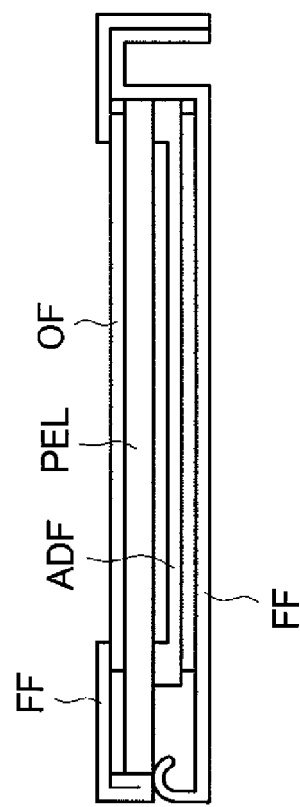
FIG. 14A is a cross-sectional view showing the cross-sectional structure of the organic EL display panel shown in FIG. 13 taken along a line A-A'.
Figure 14B:
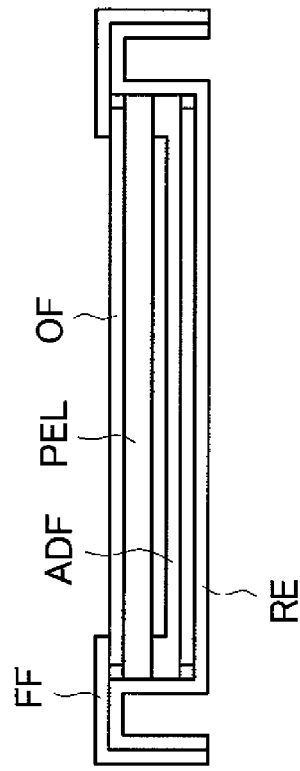
FIG. 14B is a cross-sectional view showing the cross-sectional structure of the organic EL display panel shown in FIG. 13 taken along a line B-B'.

The structure of the organic EL display panel which is sandwiched between the front frame (FF) and the rear frame (FR) is further explained in conjunction with FIG. 13, FIG. 14A and FIG. 14B.

FIG. 13 is an exploded view of an organic EL display panel as viewed from an oblique upper side of a display screen. FIG. 14A and FIG. 14B are cross-sectional views showing the cross-sectional structure of the organic EL display panel shown in FIG. 13, wherein FIG. 14A is the cross-sectional view showing the cross-sectional structure of the organic EL display panel shown in FIG. 13 taken along a line A-A', and FIG. 14B is the cross-sectional view showing the cross-sectional structure of the organic EL display panel shown in FIG. 13 taken along a line B-B'.

From a front frame (FF) side, an optical film (OF), the organic EL display panel (PEL), a heat diffusion sheet/shock absorbing agent (ADF), the rear frame (RF) are stacked in this order.

The front frame (FF) and the rear frame (RF) are formed of a metal frame made of an alloy called invar which contains iron and nickel as main components, wherein nickel amounts to approximately 36%.

The metal frame may be also made of alloy called super invar in which amount of nickel is increased. Further, by forming the metal frame using stainless steel or iron, the metal frame can be manufactured at a low cost. The front frame (FF) has a shape folded toward the back frame (RF).

Figure 15:
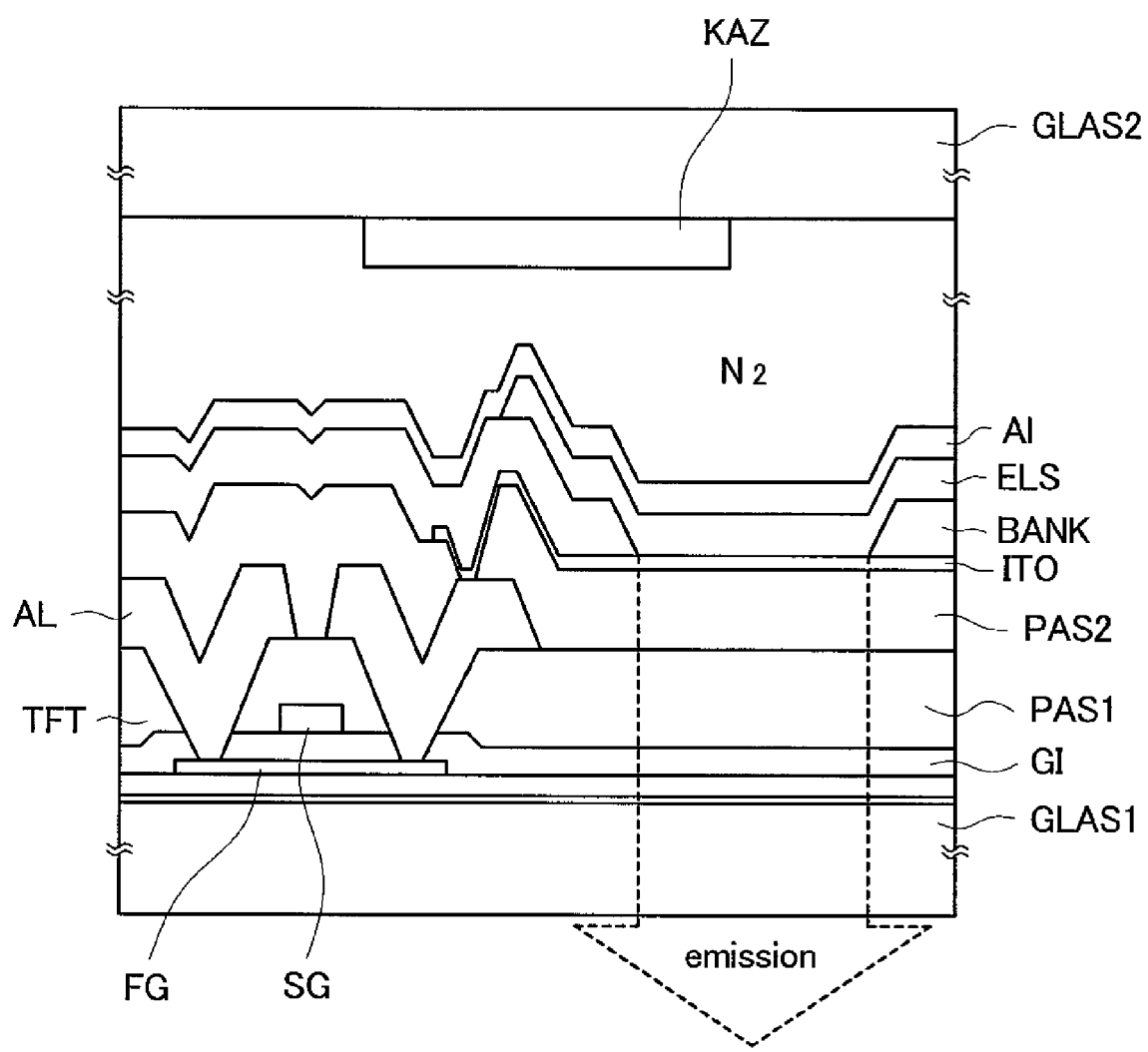
FIG. 15 is a cross-sectional view showing the cross-sectional structure of a bottom-emission-type organic EL display panel (PEL)

FIG. 15 shows the cross-sectional structure of a bottom-emission-type organic EL display panel (PEL).

Using a manufacturing process of a thin film transistor in which a semiconductor layer is made of poly-silicon, on a glass substrate (GLAS1), thin film transistors (TFTs) having the following constitution are formed. The thin film transistor (TFT) is constituted of a channel (FG), a gate insulation film (material: P-TEOS) (GI), agate line (material: MoW) (SG), a CONT insulation film (material: P-TEOS) (PAS1), an SD line (material: metal/AlSi/metal) (AL), and a passivation layer (material: P-SiN) (PAS2).

The thin film transistor (TFT) is formed by a CMOS process which is a process characterized by adding a counter dope pMOS process to an nMOS single channel process.

After forming the thin film transistor (TFT), an anode (ITO) which constitutes a lower electrode of the organic EL element 7 is formed. The bottom-emission-type organic EL display panel (PEL) sets the light take-out direction on a thin-film-transistor (TFT) substrate side and hence, the anode which constitutes the lower electrode is formed of a transparent electrode made of ITO.

After forming the anode (ITO), an SiN bank (SiL2) (BANK) is formed for preventing anode-cathode short-circuiting at an electrode end portion.

Next, organic EL layers (ELS) are formed separately corresponding to R, G and B using a precision mask in an organic EL element step (OLED step), and a cathode (AI) which constitutes an upper electrode is formed in a state that the cathode (AI) covers the whole display region. The cathode AI also functions as a reflection layer.

Finally, a sealing glass (GLAS2) which adheres a desiccant (KZA) thereto for preventing the intrusion of moisture which causes the deterioration of the organic EL element is sealed under an $N_2$ atmosphere thus completing an organic EL display panel (PEL).

Figure 16:
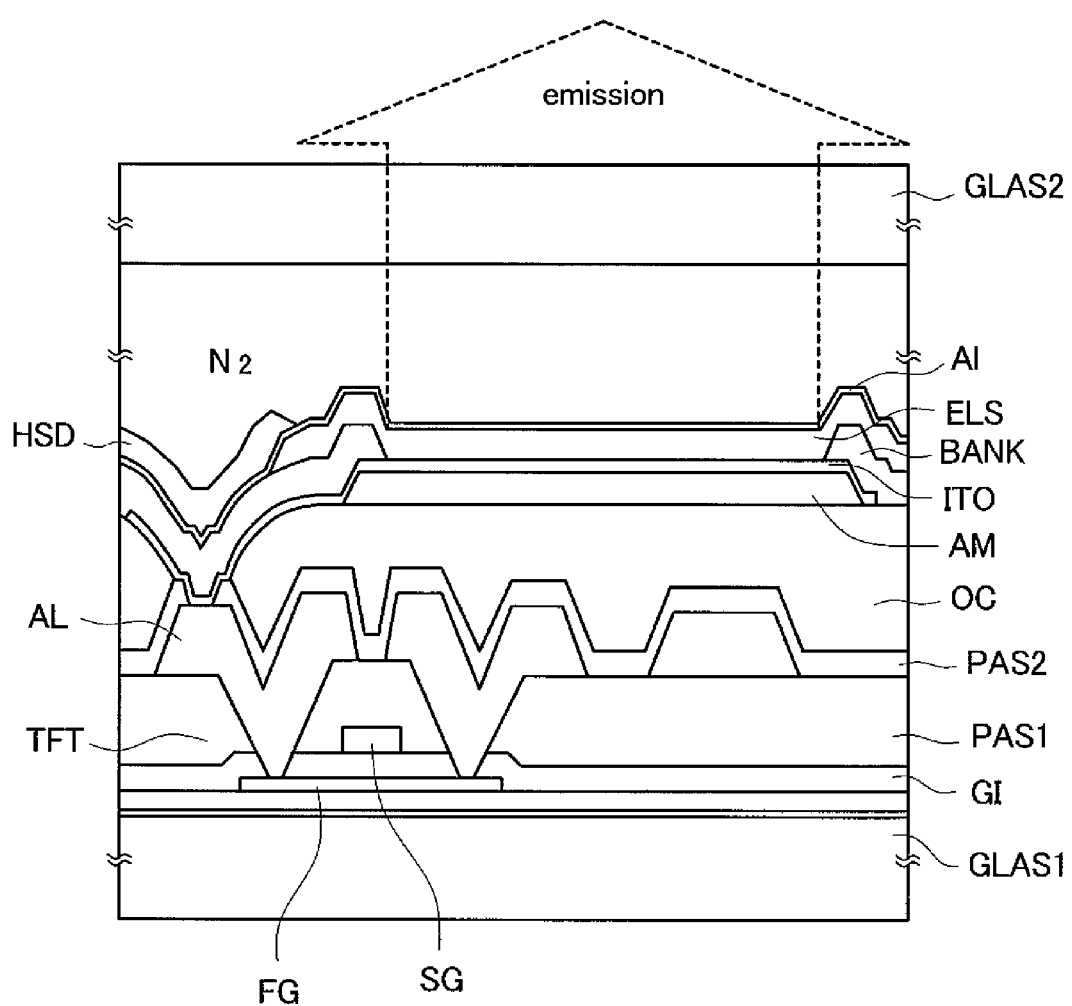
FIG. 16 is a cross-sectional view showing the cross-sectional structure of a top-emission-type organic EL display panel (PEL)

FIG. 16 shows the cross-sectional structure of a top-emission-type organic EL display panel (PEL).

Using a manufacturing process of a thin film transistor in which a semiconductor layer is made of poly-silicon, on a glass substrate (GLAS1), thin film transistors (TFTs) having the following constitution are formed. The thin film transistor (TFT) is constituted of a channel (FG), a gate insulation film (material: P-TEOS) (GI), agate line (material: MoW) (SG), a CONT insulation film (material: P-TEOS) (PAS1), an SD line (material: metal/AlSi/metal) (AL), and a passivation layer (material: P-SiN) (PAS2). The forming process of the top-emission-type organic EL display panel (PEL) is equal to the forming process of the bottom-emission-type organic EL display panel (PEL).

Thereafter, for leveling stepped portions generated by the formation of the thin film transistors (TFTs) on the passivation layer (PAS2), an organic layer (leveling layer) (OC) is formed.

The top-emission-type organic EL display panel (PEL) sets the light take-out direction on an upper side of a thin-film-transistor (TFT) substrate and hence, it is possible to arrange a pixel opening without being restricted by a pixel circuit due to the insertion of the leveling layer (OC). Accordingly, the top-emission-type organic EL display panel (PEL) can perform a high-definition display.

The leveling layer (OC) is formed of an inorganic film made of silicon nitride or the like or an organic film made of an acrylic resin, a polyimide resin or the like. The same goes for the bottom-emission-type organic EL display panel (PEL).

After forming the leveling layer (OC), reflection layers (AM) and anodes (ITO) are formed.

The reflection layers are made of AlSi (Si: not more than 1.0 wt %). Since the leveling layer (OC) possesses poor adhesiveness to metal, a layer made of MoW (Mo:80 wt %, W:20 wt %) is added as a background layer thus forming the reflection layer into the two-layered structure made of AlSi and MoW.

With respect to the electrical connection between the SD line (Al) and the anode (ITO), there are considered a method which connects the SD line (AL) and the anode (ITO) by way of a reflection layer (AM) and a method which directly connects the SD line (AL) and the anode (ITO) without interposing the reflection layer (AM). Since AlSi and ITO do not establish the ohmic connection, the SD line (AL) and the anode (ITO) are directly connected to each other.

The SD line (AL) has been conventionally formed using cap metal by taking the connection of the SD line (AL) with the anode (ITO) into consideration and hence, there arises no drawback with respect to the connection of the SD line (AL) with the anode (ITO).

After forming the anodes (ITO), an SiN bank (SiL2) (BANK) is formed for preventing anode-cathode short-circuiting at an end portion of the electrode.

Organic EL layers (ELS) are formed separately corresponding to R, G and B using a precision mask in an organic EL element step (OLED step), and a transparent cathode (IZO) which constitutes an upper electrode is formed in a state that the cathode (IZO) covers the whole display region.

Although it is necessary to make the transparent cathode (IZO) thin to prevent the optical interference, this thinning of the transparent cathode (IZO) gives rise to a drawback with respect to resistance of the transparent cathode (IZO). Accordingly, an auxiliary electrode (HSD) is formed between the pixels.

Finally, a glass substrate (GLAS2) which adheres a desiccant (not shown in the drawing) thereto for preventing the intrusion of moisture which causes the deterioration of the organic EL element is sealed under an $N_2$ atmosphere thus completing an organic EL display panel (PEL).

The organic EL display device of this embodiment is of a spontaneous light emitting type and hence, the organic EL display device exhibits high contrast and a wide viewing angle, and is thin and light-weighted. Accordingly, the organic EL display device is used as a display part of various electronic devices. For example, to allow a viewer to enjoy TV broadcasting or the like on a large screen, the organic EL display device of the present invention may be used as a display part of an EL display (a display which incorporates the organic EL display device in a housing) having a diagonal size of 30 inches or more (typically, 40 inches or more).

Here, the EL display includes all kinds of displays for information display such as a display for personal computer, a display for receiving TV broadcasting or a display for advertisement display. Besides these usages, the organic EL display device of the present invention can be used as a display part of various electronic devices. As such electronic devices, a video camera, a digital camera, a car navigation system, a car audio, a notebook personal computer, game equipment, a personal digital assistant (a mobile computer, a mobile phone, portable gaming machine, an electronic book or the like), an image reproduction device provided with a recording medium and the like are named.

Particularly, a wide viewing angle is emphasized in the personal digital assistant which is often observed from the oblique direction and hence, the use of the organic EL display device is desirable. Specific examples of these electronic devices are described hereinafter.

Figure 17:
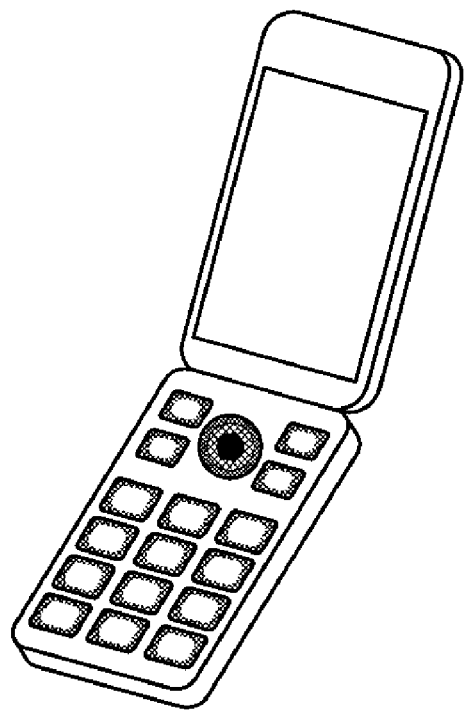
FIG. 17 is a view showing a mobile phone which uses the organic EL display device according to the embodiment of the present invention as a display part thereof.
Figure 18:
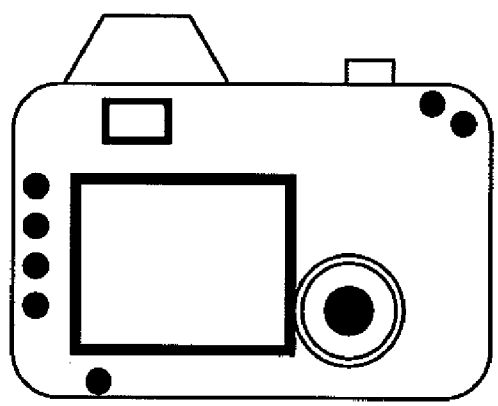
FIG. 18 is a view showing a digital still camera which uses the organic EL display device according to the embodiment of the present invention as a display part thereof.

FIG. 17 shows a mobile phone, and the organic EL display device of this embodiment can be used as a display part of the mobile phone. By displaying white characters on a black background in the display part, it is possible to reduce the power consumption of the mobile phone. FIG. 18 shows a digital still camera, and the organic EL display device of this embodiment can be used as a display part of the digital still camera. A portion which emits light consumes electric power in the organic EL display device and hence, it is desirable to display information such that the light emitting portion becomes as small as possible in area.

Figure 19:
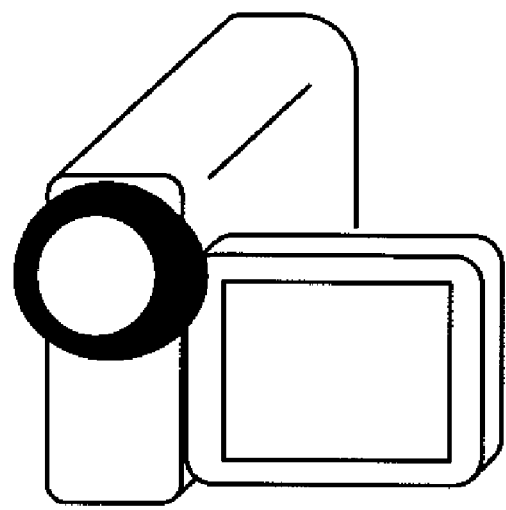
FIG. 19 is a view showing a digital video camera which uses the organic EL display device according to the embodiment of the present invention as a display part thereof.
Figure 20:
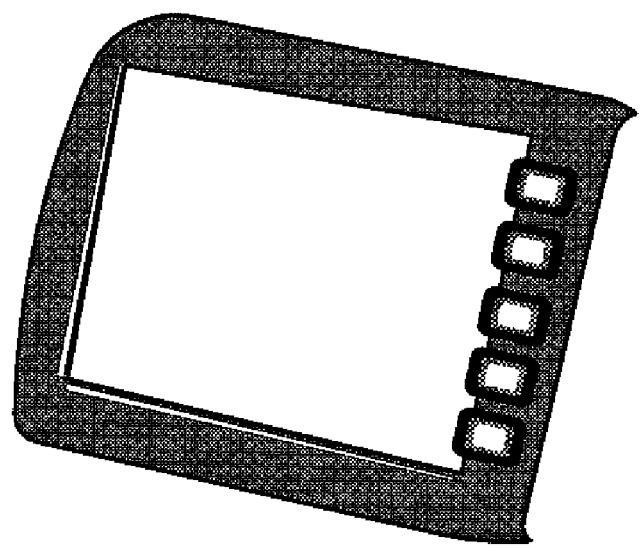
FIG. 20 is a view showing a car navigation system which uses the organic EL display device according to the embodiment of the present invention as a display part thereof.

FIG. 19 shows a digital video camera, and the organic EL display device of this embodiment can be used as a display part of the digital video camera. FIG. 20 shows a car navigation system, and the organic EL display of the embodiment can be used as a display part of the car navigation system.

As has been explained above, the application range of the organic EL display device of this embodiment is extremely wide so that the organic EL display device of this embodiment is applicable to electronic devices in various fields.

There has been a case where the organic EL display device is requested to perform a display in a plurality of brightness display modes (so-called setting of a plurality of light emission brightness). For example, with respect to the organic EL display device which is used as the display part of mobile equipment such as a digital still camera (hereinafter referred to as DSC), there has been a strong demand that the organic EL display device can set two brightness display modes, that is, a high brightness display mode for ensuring external visibility and a standard brightness display mode.

According to the organic EL display device of this embodiment, when it is necessary to set a plurality of light emission brightnesses (for example, maximum display brightness: 500 cd/m$^2$, brightness display mode: 50 steps for R, G and B respectively (256 grayscales within each step): brightness step $\leq$10 cd/m$^2$)), it is possible to acquire the high-contrast and accurate grayscale performance by defining the grayscale characteristics changed by a voltage control in the power source control part 111 such that the inflection points of the PWM signal conforms with predetermined grayscale characteristics.

Further, by changing over the PWM signal into saturated region driving in a high brightness display mode, it is possible to acquire the predetermined brightness so that outdoor visibility can be enhanced. Still further, by changing over the PWM signal into saturated region driving, it is also possible to largely reduce in-plane brightness irregularities (shading) or sticking generation time attributed to voltage drop by line resistance in non-saturated region driving.

Further, even when the anode power source part 110 is used in common among respective colors of R, G and B, it is possible to perform grayscale controls of respective pixels of R, G and B independently thus providing a display device which can perform high-quality display.

Still further, according to this embodiment, by applying the gamma adjustment to the respective pixels, it is possible to provide an organic EL display device having organic EL display elements which emit light with properly controlled light emission brightnesses.

Although the invention made by inventors of the present invention has been specifically explained in conjunction with the embodiment heretofore, the present invention is not limited to the above-mentioned embodiment, and various modifications are conceivable without departing from the gist of the present invention.

What is claimed is:

1. A display device comprising:
a plurality of signal lines which inputs a video signal to pixels each of which has a light emitting element; and
a drive circuit which supplies the video signal and a PWM signal to the signal lines, wherein
each pixel includes a drive transistor which drives the light emitting element based on the video signal, a capacitive element which is arranged between the signal line and a control electrode of the drive transistor, and a reset switching element which is arranged between the control electrode and a second electrode of the drive transistor,
one frame period includes a writing period in which the video signal is written in the pixel, and a light emission period in which the light emitting element emits light,
within the light emission period, the reset switching element is turned off and the PWM signal is supplied to the signal line from the drive circuit, and
a cycle of the PWM signal in a low brightness display mode is shorter than a cycle of the PWM signal in a standard brightness display mode.

2. A display device comprising:
a plurality of signal lines which inputs a video signal to pixels each of which has a light emitting element; and
a drive circuit which supplies the video signal and a PWM signal to the signal lines, wherein
each pixel includes a drive transistor which drives the light emitting element based on the video signal, a capacitive element which is arranged between the signal line and a control electrode of the drive transistor, and a reset switching element which is arranged between the control electrode and a second electrode of the drive transistor,
one frame period includes a writing period in which the video signal is written in the pixel, and a light emission period in which the light emitting element emits light,
within the light emission period, the reset switching element is turned off and the PWM signal is supplied to the signal line from the drive circuit,
the display device has two or more brightness display modes,
the PWM signal supplied to the signal line from the drive circuit within the light emission period has at least one or more inflection points for making the inclination of the PWM signal different before and after the inflection point, and
the position of the inflection point differs for every brightness display mode.

3. A display device according to claim 2, wherein the drive transistor is operated in a saturated region within the light emission period with respect to at least one or more brightness display modes.

4. A display device according to claim 2, wherein the plurality of pixels includes a group of pixels of first color, a group of pixels of second color and a group of pixels of third color, and positions of inflection points of the PWM signal differ from each other for the pixels of every color.

5. A display device comprising:
a plurality of pixels each of which includes a light emitting element;
a plurality of signal lines which inputs a video signal to the pixels; and
a drive circuit which supplies the video signal and a PWM signal to the respective signal lines, wherein
each pixel includes a drive transistor which drives the light emitting element based on the video signal, a capacitive element which is connected between the corresponding signal line and a control electrode of the drive transistor, and a reset switching element which is connected between the control electrode and a second electrode of the drive transistor,
a first electrode of the drive transistor is connected to a first power source,
the other end of the light emitting element is connected to a second power source,
one frame period includes a writing period in which the video signal is written in the respective pixels and a light emission period,
the reset switching elements of all pixels are turned off within the light emission period so that the PWM signal is supplied to the signal line from the drive circuit,
the display device has two or more brightness display modes,
the drive transistor is operated in a saturated region within the light emission period with respect to at least one or more brightness display modes, and
the PWM signal which is supplied to the signal lines from the drive circuit within the light emission period is a PWM signal having a rectangular waveform or a trapezoidal waveform.

6. A display device according to claim 1, wherein the predetermined brightness display mode is selected out of the two or more brightness display modes corresponding to brightness of an external light.

7. A display device according to claim 2, wherein the predetermined brightness display mode is selected out of the two or more brightness display modes corresponding to brightness of an external light.

8. A display device according to claim 5, wherein the predetermined brightness display mode is selected out of the two or more brightness display modes corresponding to brightness of an external light.

9. A display device according to claim 1, wherein each of the pixels includes a lighting control switching element which is connected between the second electrode of the drive transistor and one end of the light emitting element, and the lighting control switching element is turned on within the light emission period.

10. A display device according to claim 2, wherein each of the pixels includes a lighting control switching element which is connected between the second electrode of the drive transistor and one end of the light emitting element, and the lighting control switching element is turned on within the light emission period.

11. A display device according to claim 5, wherein each of the pixels includes a lighting control switching element which is connected between the second electrode of the drive transistor and one end of the light emitting element, and the lighting control switching element is turned on within the light emission period.

12. A display device according to claim 9, wherein the video signal is supplied to the respective signal lines within the writing period, the reset switching elements and the lighting control switching elements of all pixels are turned on within a front half period of the writing period, and the reset switching elements of all pixels are turned on within a rear half period of the writing period and the lighting control switching elements of all pixels are turned off within the rear half period of the writing period.

13. A display device according to claim 10, wherein the video signal is supplied to the respective signal lines within the writing period, the reset switching elements and the lighting control switching elements of all pixels are turned on within a front half period of the writing period, and the reset switching elements of all pixels are turned on within a rear half period of the writing period and the lighting control switching elements of all pixels are turned off within the rear half period of the writing period.

14. A display device according to claim 11, wherein the video signal is supplied to the respective signal lines within the writing period, the reset switching elements and the lighting control switching elements of all pixels are turned on within a front half period of the writing period, and the reset switching elements of all pixels are turned on within a rear half period of the writing period and the lighting control switching elements of all pixels are turned off within the rear half period of the writing period.

15. A display device according to claim 1, wherein the drive transistor is a p-type field effect transistor, and a cathode electrode of the light emitting element is connected to a second power source.

16. A display device according to claim 2, wherein the drive transistor is a p-type field effect transistor, and a cathode electrode of the light emitting element is connected to a second power source.

17. A display device according to claim 5, wherein the drive transistor is a p-type field effect transistor, and a cathode electrode of the light emitting element is connected to the second power source voltage.

* * * * *